US011636996B2

(12) United States Patent
Chubun et al.

(10) Patent No.: US 11,636,996 B2
(45) Date of Patent: Apr. 25, 2023

(54) MAGNETIC IMMERSION ELECTRON GUN (71) Applicant: KLA Corporation, Milpitas, CA (US)

(72) Inventors: Nikolai N. Chubun, San Jose, CA (US); Martin Brutsch, San Jose, CA (US); Laurence S. Hordon, Mountain View, CA (US)

(73) Assignee: KLA Corporation, Milpitas, CA (US)

( * ) Notice: Subject to any disclaimer, the term of this patent is extended or adjusted under 35 U.S.C. 154(b) by 0 days.

(21) Appl. No.: 17/465,068

(22) Filed: Sep. 2, 2021

(65) Prior Publication Data

US 2022/0076914 A1 Mar. 10, 2022

Related U.S. Application Data (60) Provisional application No. 63/075,832, filed on Sep. 9, 2020.

(51) Int. Cl.
*H01J 37/141* (2006.01)
*H01J 37/075* (2006.01)

(52) U.S. Cl.
CPC .......... *H01J 37/141* (2013.01); *H01J 37/075* (2013.01)

(58) Field of Classification Search
CPC ............................ H01J 37/141; H01J 37/075
See application file for complete search history.

(56) References Cited

U.S. PATENT DOCUMENTS

| 5,831,379 | A | 11/1998 | Jeong et al. |
| 7,902,529 | B2 * | 3/2011 | Quarmby ............... H01J 49/147 |
| | | | 250/493.1 |
| 2011/0002447 | A1 | 1/2011 | Lemarchand et al. |
| 2014/0299768 | A1 | 10/2014 | Shichi et al. |

FOREIGN PATENT DOCUMENTS

| EP | 2492949 B1 | 6/2017 |
| EP | 2174340 B1 | 12/2017 |
| JP | 2019021606 A1 | 2/2019 |

OTHER PUBLICATIONS

WIPO, ISR for International Application No. PCT/US2021/049189, dated Dec. 23, 2021.

* cited by examiner

*Primary Examiner* — Joseph L Williams
(74) *Attorney, Agent, or Firm* — Hodgson Russ LLP (57) ABSTRACT

The present disclosure provides a magnetic immersion electron gun and a method of generating an electron beam using a magnetic immersion electron gun. The electron gun includes a magnetic lens forming a magnetic field, a cathode tip disposed in the magnetic field, and a multi-filament heater configured to directly heat the cathode tip to emit electrons through the magnetic lens. The multi-filament heater includes a first filament connected at each end to first and second positive terminals of a power source and a second filament connected at each end to first and second negative terminals of the power source. The first positive terminal, the second positive terminal, the first negative terminal, and the second negative terminal are arranged alternately around the cathode tip such that the first filament and the second filament intersect at the cathode tip and a resultant magnetic force applied to the cathode tip is reduced.

20 Claims, 5 Drawing Sheets

MAGNETIC IMMERSION ELECTRON GUN

CROSS-REFERENCE TO RELATED APPLICATIONS

This application claims priority to the provisional patent application filed Sep. 9, 2020 and assigned U.S. App. No. 63/075,832, the disclosure of which is hereby incorporated by reference.

FIELD OF THE DISCLOSURE

This disclosure relates to an electron gun for an electron beam system and, more particularly, to an electron gun with a magnetic lens.

BACKGROUND OF THE DISCLOSURE

Evolution of the semiconductor manufacturing industry is placing greater demands on yield management and, in particular, on metrology and inspection systems. Critical dimensions continue to shrink, yet the industry needs to decrease time for achieving high-yield, high-value production. Minimizing the total time from detecting a yield problem to fixing it determines the return-on-investment for a semiconductor manufacturer.

Fabricating semiconductor devices, such as logic and memory devices, typically includes processing a semiconductor wafer or EUV mask using a large number of fabrication processes to form various features and multiple levels of the semiconductor devices. For example, lithography is a semiconductor fabrication process that involves transferring a pattern from a reticle to a photoresist arranged on a semiconductor wafer. Additional examples of semiconductor fabrication processes include, but are not limited to, chemical-mechanical polishing (CMP), etch, deposition, and ion implantation. Multiple semiconductor devices may be fabricated in an arrangement on a single semiconductor wafer that are separated into individual semiconductor devices.

Inspection processes are used at various steps during semiconductor manufacturing to detect defects on wafers to promote higher yield in the manufacturing process and, thus, higher profits. Inspection has always been an important part of fabricating semiconductor devices such as integrated circuits (ICs). However, as the dimensions of semiconductor devices decrease, inspection becomes even more important to the successful manufacture of acceptable semiconductor devices because smaller defects can cause the devices to fail. For instance, as the dimensions of semiconductor devices decrease, detection of defects of decreasing size has become necessary because even relatively small defects may cause unwanted aberrations in the semiconductor devices.

One device used for inspection processes is an electron beam system. In an electron beam system, electrons are emitted from a cathode tip of an electron gun focused onto a target. The cathode tip is heated using by a current-carrying hairpin filament heater to generate the electrons. A magnetic lens is used to focus the electrons into an electron beam onto the target. In particular, the magnetic lens generates a magnetic field, which draws the electrons from the cathode tip toward the target.

In previous designs, the magnetic field may apply a magnetic force to the current-carrying filaments of the heater. This magnetic force may cause immediate deflection of the cathode tip. For example, the immediate deflection may cause the cathode tip to displace a few microns. In addition, the cathode tip may experience high temperature creeping, which may cause the cathode tip to slowly move in the same direction as the immediate deflection over time. For example, the high temperature creep may cause the cathode tip to displace up to 40 microns over one year. When displacement exceeds as much as 2 microns, cathode re-alignment is needed. Repeated realignments of the cathode tip reduces tool availability and increases cost of service. The useful life of the electron gun is reduced, which requires more frequent replacement.

Therefore, what is needed is an electron gun which is less susceptible to displacement caused by magnetic deflection and high temperature creep.

BRIEF SUMMARY OF THE DISCLOSURE

An embodiment of the present disclosure provides a magnetic immersion electron gun. The electron gun may comprise a magnetic lens forming a magnetic field, a cathode tip disposed in the magnetic field, and a multi-filament heater configured to directly heat the cathode tip to emit electrons through the magnetic lens. The multi-filament heater may comprise a first filament connected at each end to a first positive terminal and a second positive terminal of a power source, and a second filament connected at each end to a first negative terminal and a second negative terminal of the power source. The first positive terminal, the second positive terminal, the first negative terminal, and the second negative terminal may be arranged alternately around the cathode tip such that the first filament and the second filament intersect at the cathode tip and magnetic forces applied by the magnetic field to the first filament and the second filament cancel out to reduce a resultant magnetic force applied to the cathode tip.

According to embodiments of the present disclosure, the first filament and the second filament may have a same cross-section, may be made from a same material, and may carry a same current. The material may be a tungsten-rhenium alloy including up to 27% rhenium.

According to embodiments of the present disclosure, the first filament may be comprised of a first material, the second filament may be comprised of a second material different from the first material, and a cross-section of the first filament and a cross-section of the second filament may be inversely proportional to a specific resistance of the first material and a specific resistance of the second material. The first material may be a tungsten-rhenium alloy including up to 5% rhenium, and the second material may be a tungsten-rhenium alloy including from 20 to 27% rhenium.

According to embodiments of the present disclosure, the first filament and the second filament may be orthogonal.

According to embodiments of the present disclosure, the multi-filament heater may be configured to directly heat the cathode tip to a temperature between 1600K and 1900K.

According to embodiments of the present disclosure, the magnetic field may have a magnetic flux density between 100 Gauss and 1000 Gauss.

Another embodiment of the present disclosure provides a magnetic immersion electron gun. The electron gun may comprise a magnetic lens forming a magnetic field, a cathode tip disposed in the magnetic field, and a multi-filament heater configured to directly heat the cathode tip to emit electrons through the magnetic lens. The multi-filament heater may comprise a first filament and a second filament connected at each end to a positive terminal and a negative terminal of a power source, and the first filament and the second filament may intersect at the cathode tip.

According to embodiments of the present disclosure, the first filament and the second filament may intersect at an acute angle.

An embodiment of the present disclosure provides a method of generating an electron beam using a magnetic immersion electron gun. The method may comprise applying a current from a power source to a first filament and a second filament of a multi-filament heater. The first filament may be connected at each end to a first positive terminal and a second positive terminal of the power source, and the second filament may be connected at each end to a first negative terminal and a second negative terminal of the power source.

The method may further comprise heating a cathode tip using the first filament and the second filament. The first filament and the second filament may intersect at the cathode tip, and the first positive terminal, the second positive terminal, the first negative terminal, and the second negative terminal may be arranged alternately around the cathode tip.

The method may further comprise emitting electrons from the cathode tip through a magnetic lens toward a target. The cathode tip may be disposed in a magnetic field formed by the magnetic lens, and magnetic forces applied by the magnetic field to the first filament and the second filament may cancel out to reduce a resultant magnetic force applied to the cathode tip.

According to embodiments of the present disclosure, applying a current from a power source to the first filament and the second filament may comprise applying a first current to the first filament, and applying a second current to the second filament. The first current may be equal to the second current.

According to embodiments of the present disclosure, heating the cathode tip to using the first filament and the second filament may comprise heating the cathode tip to using the first filament and the second filament to a temperature between 1600K and 1900K.

DESCRIPTION OF THE DRAWINGS

For a fuller understanding of the nature and objects of the disclosure, reference should be made to the following detailed description taken in conjunction with the accompanying drawings, in which.

DETAILED DESCRIPTION OF THE DISCLOSURE

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims.

Figure 1A:
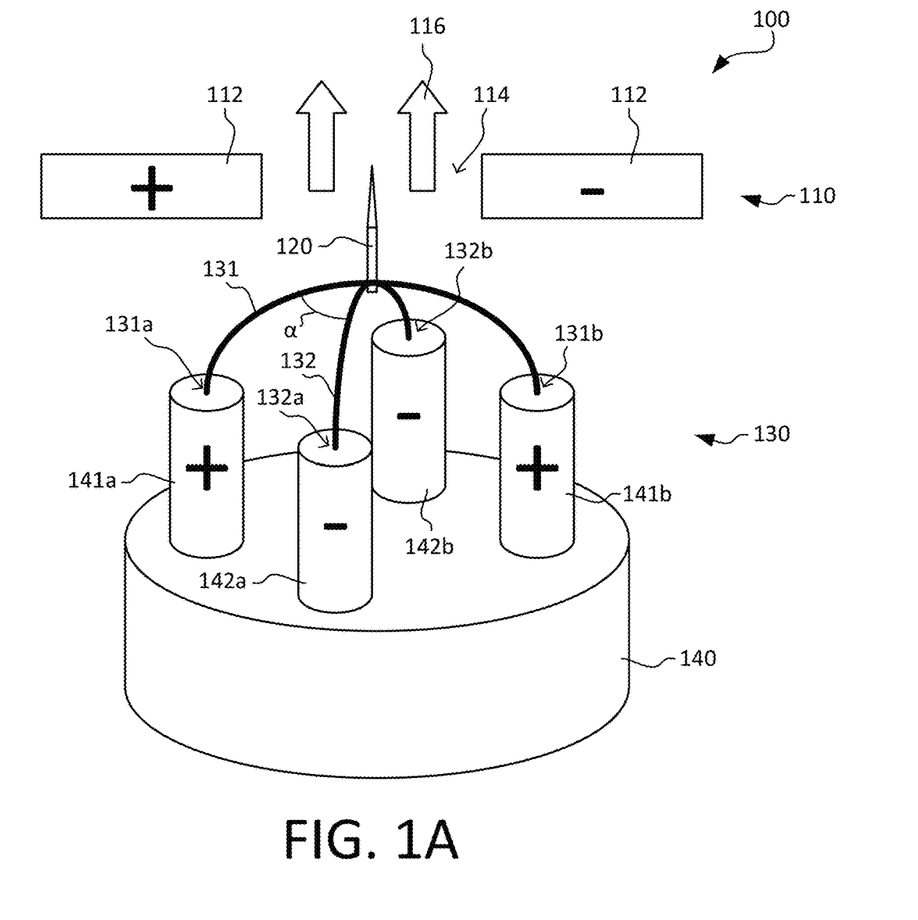
FIG. 1A is a schematic diagram of a magnetic immersion electron gun according to an embodiment of the present disclosure.

An embodiment of the present disclosure provides a magnetic immersion electron gun 100, as shown in FIG. 1A. The electron gun 100 may comprise a magnetic lens 110. As shown in FIG. 2B, the magnetic lens 110 may be comprised of a pair of pole pieces 112 having opposite polarity. The magnetic lens 110 may have an annular shape, defining an aperture 114. The aperture 114 may have a diameter of less than 1 mm. For example, the aperture 114 may have a diameter between 50 and 100 microns. The pole pieces 112 may form a magnetic field 116 in the aperture 114, shown as coming out of the page in FIG. 2B. The magnetic field 116 may have a magnetic flux density between 100 Gauss and 1000 Gauss, or more. For example, the magnetic field 116 may have a magnetic flux density of 600 Gauss.

Referring back to FIG. 1A, the electron gun 100 may further comprise a cathode tip 120. The cathode tip 120 may be comprised of tungsten single crystal. The cathode tip 120 may be a sharp needle about 2 mm long and 120 µm in diameter. The end of the cathode tip 120 may be less than 1 micron. The cathode tip 120 may be disposed in the magnetic field 116. For example, the cathode tip 120 may be disposed in the aperture 114 of the magnetic lens 110.

The electron gun 100 may further comprise a multi-filament heater 130. The heater 130 may be configured to directly heat the cathode tip 120. The heater 130 may heat the cathode tip 120 to a temperature between 1600K and 1900K. For example, the heater 130 may heat the cathode tip 120 to a temperature of 1800K. By directly heating the cathode tip 120 using the heater 130, the cathode tip 120 may emit electrons through the magnetic lens 110. The magnetic field 116 may focus the electrons and direct the electrons toward a target.

The multi-filament heater 130 may comprise a first filament 131. The first filament 131 may be connected at each end to a first positive terminal 141a and a second positive terminal 141b of a power source 140. For example, a first end 131a of first filament 131 may be connected to the first positive terminal 141a of the power source 140, and a second end 131b of the first filament 131 may be connected to the second positive terminal 141b of the power source 140.

The multi-filament heater 130 may further comprise a second filament 132. The second filament 132 may be connected at each end to a first negative terminal 142a and a second negative terminal 142b. For example, a first end 132a of the second filament 132 may be connected to the first negative terminal 142a of the power source 140, and a second end 132b of the second filament 132 may be connected to the second negative terminal 142b of the power source 140.

According to an embodiment of the present disclosure, the first positive terminal 141a, the second positive terminal 141*b*, the first negative terminal 142*a*, and the second negative terminal 142*b* of the power source 140 may be arranged alternately around the cathode tip 120. For example, the first filament 131 and the second filament 132 may intersect at the cathode tip 120. The first filament 131 and the second filament 132 may intersect at an angle α between 0 degrees (i.e., touching but not crossing) and 90 degrees. For example, the first filament 131 and the second filament 132 may be orthogonal, i.e., the angle α may be about 90 degrees. In this way, current from the power source 140 may travel through the first filament 131 and the second filament 132 to directly heat the cathode tip 120.

It can be appreciated that the magnetic field 116 may apply a magnetic force to the first filament 131 and the second filament 132 due to the residual magnetic field generated by the current from the power source 140. In previous designs, this magnetic force may cause immediate deflection of the cathode tip 120. For example, the immediate deflection may cause the cathode tip 120 to displace a few microns in a direction perpendicular to the magnetic field 116. In addition, the cathode tip 120 may experience high temperature creeping, which may cause the cathode tip 120 to slowly move in the same direction as the immediate deflection over time. For example, the high temperature creep may cause the cathode tip 120 to displace up to 40 microns over one year. When displacement exceeds as much as 2 microns, cathode re-alignment may be needed. However, with the electron gun 100 of the present disclosure, displacement of the cathode tip 120 due to the magnetic force may be reduced. For example, based on the alternating arrangement of the first positive terminal 141*a*, the second positive terminal 141*b*, the first negative terminal 142*a*, and the second negative terminal 142*b* of the power source 140, the magnetic forces applied by the magnetic field 116 to the first filament 131 and the second filament 132 may cancel out, such that the resultant magnetic force applied to the cathode tip 120 may be reduced to less than 20% (i.e., a reduction of 80% or more) or less than 10% (i.e., a reduction of 90% or more). This can avoid creep.

Figure 1B:
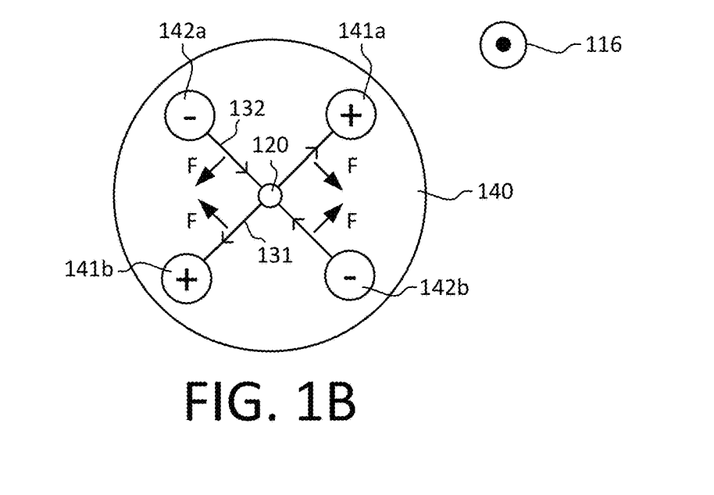
FIG. 1B is a magnetic field diagram illustrating magnetic forces on the magnetic immersion electron gun of FIG. 1A.

Referring to FIG. 1B, the current from the power source 140 is shown as flowing from the first negative terminal 142*a* and the second negative terminal 142*b* to the cathode tip 120, and the current flows from the cathode tip 120 to the first positive terminal 131*a* and the second positive terminal 131*b* of the power source 140. The magnetic field 116 generated by the magnetic lens 110 is shown as coming out of the page. The magnetic field 116 applies magnetic forces F to the first filament 131 and the second filament 132, in the direction shown by the arrows. As can be seen, the magnetic forces F applied to the first filament 131 and the second filament 132 cancel out due to the alternating arrangement of the first positive terminal 141*a*, the second positive terminal 141*b*, the first negative terminal 142*a*, and the second negative terminal 142*b* of the power source 140.

According to an embodiment of the present disclosure, the first filament 131 and the second filament 132 may have the same cross-section. For example, the first filament 131 and the second filament 132 may have a diameter of 30 to 250 μm. In a particular embodiment, the first filament 131 and the second filament may have a diameter of 50 to 150 μm. The first filament 131 and the second filament 132 may be made from a same material. For example, the first filament 131 and the second filament 132 may be a tungsten-rhenium alloy. The tungsten-rhenium alloy may include up to 27% rhenium. For example, the tungsten-rhenium alloy may include 1%, 3%, 5%, 13%, or 20% rhenium, or other commonly-available tungsten-rhenium alloys. Other tungsten alloys may be used. The first filament 131 and the second filament 132 may carry the same current. For example, the current may be between 1A and 2 A, but other currents may be applied depending on the particular design and system conditions. It can be appreciated that the similarity of the parameters of the first filament 131 and the second filament 132 may result in similar magnetic forces being applied by the magnetic field 116 in opposing directions. Therefore, the magnetic forces applied to the first filament 131 and the second filament 132 may cancel out and reduce displacement of the cathode tip 120.

According to an embodiment of the present disclosure, the first filament 131 and the second filament 132 may be made of different materials. For example, the first filament 131 may be comprised of a first material, and the second filament 132 may be comprised of a second material. The first material may be a tungsten-rhenium alloy including up to 5% rhenium. The second material may be a tungsten-rhenium alloy including 20% to 27% rhenium. Other combinations of tungsten alloys may be used. The first filament 131 and the second filament 132 may have different cross sections. For example, a cross-section of the first filament 131 and a cross-section of the second filament 132 may be inversely proportional to a specific resistance of the first material and a specific resistance of the second material. In a particular embodiment, the first filament 131 may have a diameter of 70 to 80 microns, and the second filament 132 may have a diameter of 110 to 120 microns. The first filament 131 and the second filament 132 may carry the different currents. It can be appreciated that the specific parameters of the first filament 131 and the second filament 132 may be different, but they may still result in similar magnetic forces applied by the magnetic field 116 in opposing directions. Therefore, the magnetic forces applied to the first filament 131 and the second filament 132 may cancel out and reduce displacement of the cathode tip.

Figure 2A:
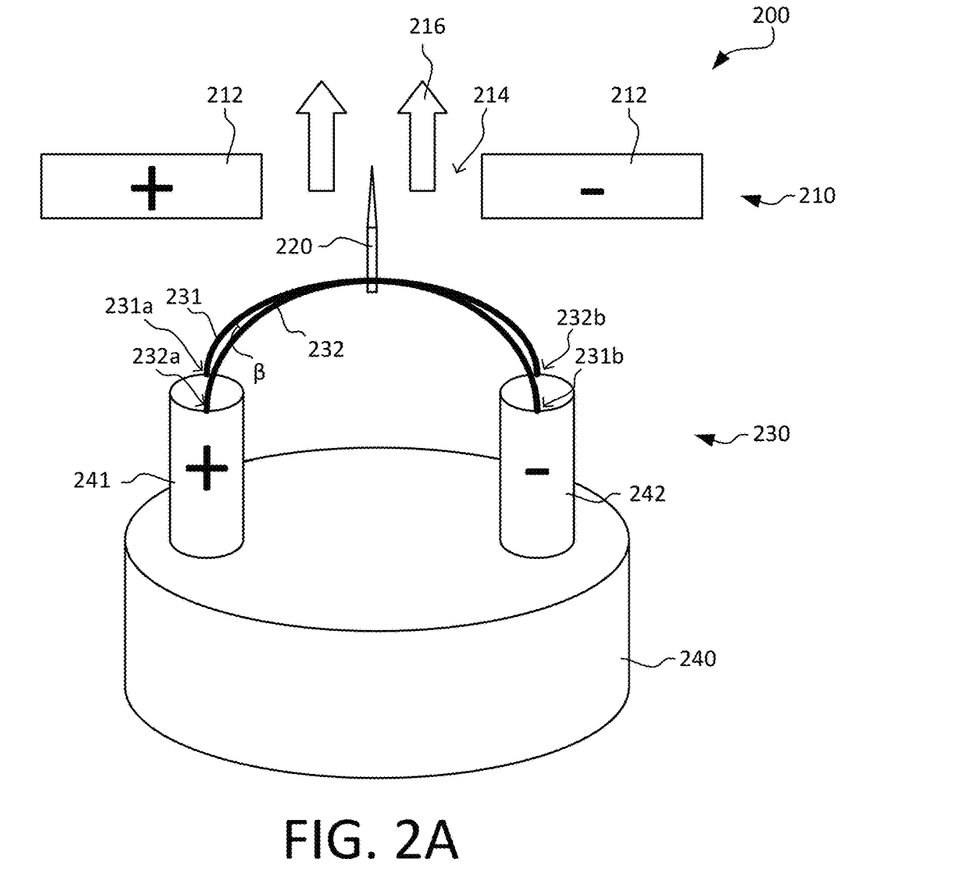
FIG. 2A is a schematic diagram of a magnetic immersion electron gun according to another embodiment of the present disclosure.
Figure 2B:
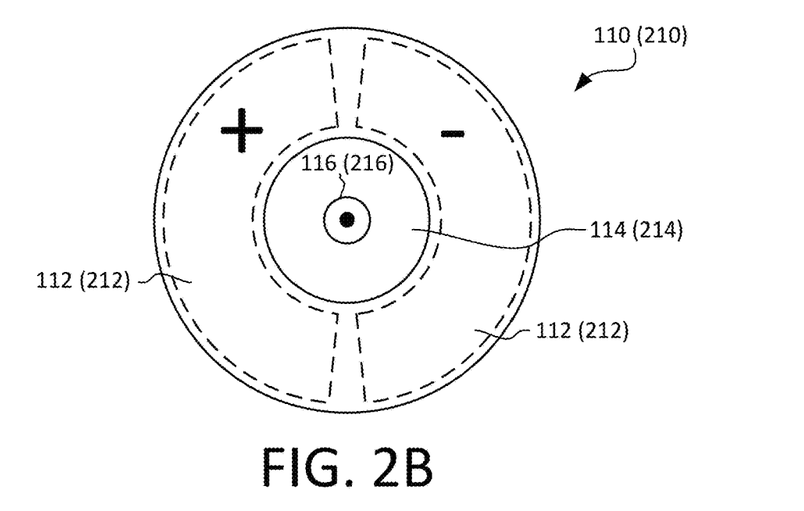
FIG. 2B is a schematic diagram of a magnetic lens of a magnetic immersion electron gun according to embodiments of the present disclosure.

Another embodiment of the present disclosure provides a magnetic immersion electron gun 200, as shown in FIG. 2A. The electron gun 200 may comprise a magnetic lens 210. As shown in FIG. 2B, the magnetic lens 210 may be comprised of a pair of pole pieces 212 having opposite polarity. The magnetic lens 210 may have an annular shape, defining an aperture 214. The aperture 214 may have a diameter of less than 1 mm. For example, the aperture 214 may have a diameter between 50 and 100 microns. The pole pieces 212 may form a magnetic field 216 in the aperture 214, shown as coming out of the page in FIG. 2B. The magnetic field 216 may have a magnetic flux density between 100 Gauss and 1000 Gauss, or more. For example, the magnetic field 216 may have a magnetic flux density of 600 Gauss.

Referring back to FIG. 2A, the electron gun 200 may further comprise a cathode tip 220. The cathode tip 220 may be comprised of tungsten single crystal. The cathode tip 220 may be a sharp needle about 2 mm long and 120 μm in diameter. The end of the cathode tip 220 may be less than 1 micron. The cathode tip 220 may be disposed in the magnetic field 216. For example, the cathode tip 220 may be disposed in the aperture 114 of the magnetic lens 110.

The electron gun 200 may further comprise a multi-filament heater 230. The heater 230 may be configured to directly heat the cathode tip 220. The heater 230 may heat the cathode tip 220 to a temperature between 1600K and 1900K. For example, the heater 230 may heat the cathode tip 220 to a temperature of 1800K. By directly heating the cathode tip 220 using the heater 230, the cathode tip 220 may emit electrons through the magnetic lens 210. The magnetic field 216 may focus the electrons and direct the electrons toward a target.

The multi-filament heater 230 may comprise a first filament 231 and a second filament 232. The first filament 231 and the second filament 232 may be connected at each end to a positive terminal 241 and a negative terminal 242 of a power source 240. For example, a first end 231*a* of the first filament 231 and a first end 232*a* of the second filament 232 may be connected to the positive terminal 241 of the power source 240, and a second end 231*b* of the first filament 231 and a second end 232*b* of the second filament 232 may be connected to the negative terminal 242 of the power source 240.

According to an embodiment of the present disclosure, the first filament 231 and the second filament 232 may intersect at the cathode tip 220. The first filament 231 and the second filament 232 may intersect at an angle β between 0 degrees (i.e., touching but not crossing) and 90 degrees. For example, the first filament 231 and the second filament 232 may intersect at an acute angle. In this way, current from the power source 240 may travel through the first filament 231 and the second filament 232 to directly heat the cathode tip 220.

It can be appreciated that the magnetic field 216 may apply a magnetic force to the first filament 231 and the second filament 232 due to the residual magnetic field generated by the current from the power source 240. In previous designs, this magnetic force may cause immediate deflection of the cathode tip 220. For example, the immediate deflection may cause the cathode tip 220 to displace a few microns in a direction perpendicular to the magnetic field 216. In addition, the cathode tip 220 may experience high temperature creeping, which may cause the cathode tip 220 to slowly move in the same direction as the immediate deflection over time. For example, the high temperature creep may cause the cathode tip 220 to displace up to 40 microns over one year. When displacement exceeds as much as 2 microns, cathode re-alignment may be needed. However, with the electron gun 200 of the present disclosure, displacement of the cathode tip 220 due to the magnetic force may be reduced. For example, based on the intersecting arrangement of the first filament 231 and the second filament 232, the heater 230 may be stiffer than previous designs, and therefore displacement caused by the magnetic forces applied by the magnetic field 216 may be reduced. The heater 230 may be 6 to 12 times stiffer than previous designs.

According to an embodiment of the present disclosure, the first filament 231 and the second filament 232 may have the same cross-section. For example, the first filament 231 and the second filament 232 may have a diameter of 30 to 250 µm. In a particular embodiment, the first filament 231 and the second filament 232 may have a diameter of 50 to 150 µm. The first filament 231 and the second filament 232 may be made from a same material. For example, the first filament 231 and the second filament 232 may be a tungsten-rhenium alloy. The tungsten-rhenium alloy may include up to 27% rhenium. For example, the tungsten-rhenium alloy may include 1%, 3%, 5%, 13%, or 20% rhenium, or other commonly-available tungsten-rhenium alloys. Other tungsten alloys may be used. The first filament 231 and the second filament 232 may carry the same current. For example, the current may be between 1 A and 2 A, but other currents may be applied depending on the particular design and system conditions. It can be appreciated that the similarity of the parameters of the first filament 231 and the second filament 232 may result in a uniform stiffness in the heater 230. Therefore, the magnetic forces applied to the first filament 231 and the second filament 232 may result in reduced displacement of the cathode tip 220 compared to prior art designs due to the stiffness of the electron gun 200.

Figure 3A:
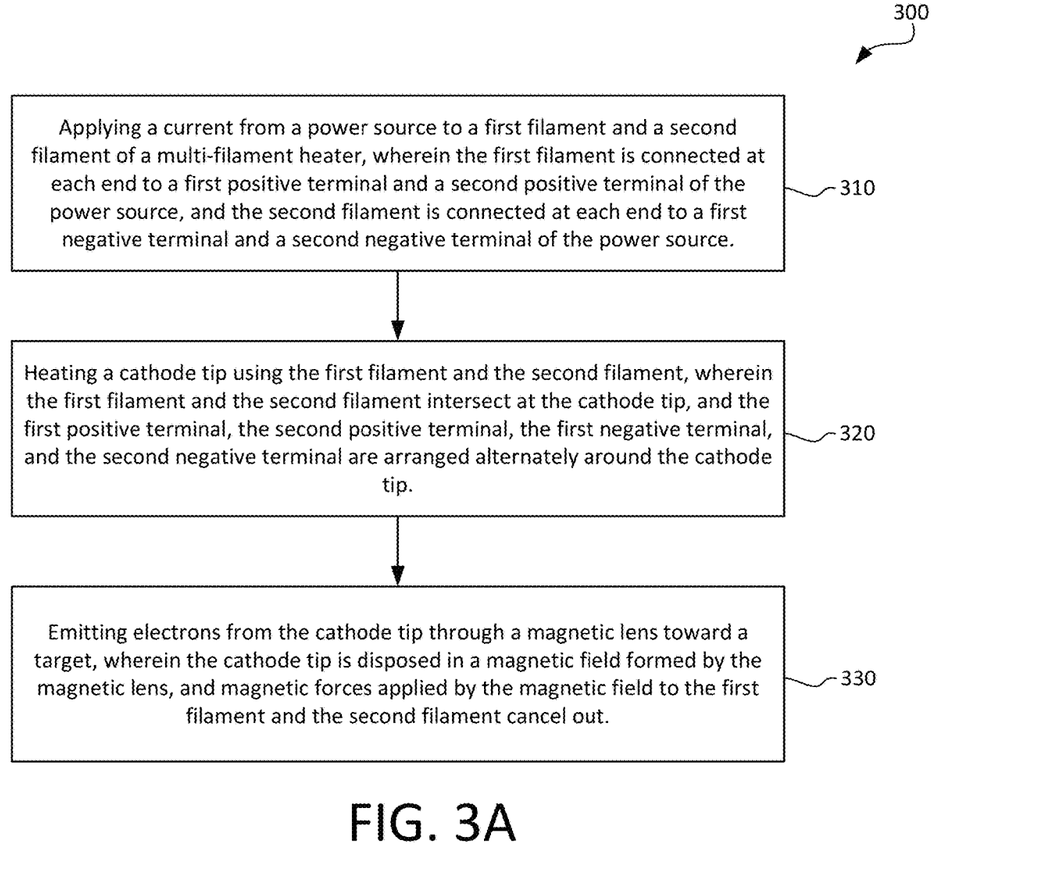
FIG. 3A is a flowchart of a method of generating an electron beam using a magnetic immersion electron gun according to an embodiment of the present disclosure.

An embodiment of the present disclosure provides a method 300 of generating an electron beam using a magnetic immersion electron gun. The method 300 may be applied to the electron gun 100 of the present disclosure. As shown in FIG. 3A, the method 300 may comprise the following steps.

At step 310, a current from a power source is applied to a first filament and a second filament of a multi-filament heater. The first filament may be connected at each end to a first positive terminal and a second positive terminal of the power source, and the second filament may be connected at each end to a first negative terminal and a second negative terminal of the power source. For example, a first end of first filament may be connected to the first positive terminal of the power source, and a second end of the first filament may be connected to the second positive terminal of the power source. A first end of the second filament may be connected to the first negative terminal of the power source, and a second end of the second filament may be connected to the second negative terminal of the power source. An example of this is shown in FIGS. 1A-1B.

At step 320, a cathode tip is heated using the first filament and the second filament. The cathode tip may be comprised of tungsten single crystal. The cathode tip may be a sharp needle about 2 mm long and 120 µm in diameter. The end of the cathode tip may be less than 1 micron. The heater may heat the cathode tip to a temperature between 1600K and 1900K. For example, the heater may heat the cathode tip to a temperature of 1800K. The first positive terminal, the second positive terminal, the first negative terminal, and the second negative terminal of the power source may be arranged alternately around the cathode tip, such that the first filament and the second filament intersect at the cathode tip. The first filament and the second filament may intersect at an angle between 0 degrees (i.e., touching but not crossing) and 90 degrees. For example, the first filament and the second filament may be orthogonal. In this way, current from the power source may travel through the first filament and the second filament to directly heat the cathode tip.

At step 330, electrons are emitted from the cathode tip through a magnetic lens toward a target. The magnetic lens may be comprised of a pair of pole pieces having opposite polarity. The magnetic lens may have an annular shape, defining an aperture. The aperture may have a diameter of less than 1 mm. For example, the aperture may have a diameter between 50 and 100 microns. The pole pieces may form a magnetic field in the aperture. The magnetic field may have a magnetic flux density between 100 Gauss and 1000 Gauss, or more. For example, the magnetic field may have a magnetic flux density of 600 Gauss. The cathode tip may be disposed in a magnetic field formed by the magnetic lens. For example, the cathode tip may be disposed in the aperture. Magnetic forces applied by the magnetic field to the first filament and the second filament may cancel out, such that the resultant magnetic force applied to the cathode tip may be reduced to less than 20% (i.e., a reduction of 80% or more) or less than 10% (i.e., a reduction of 90% or more). This can avoid creep.

It can be appreciated that the magnetic field may apply a magnetic force to the first filament and the second filament due to the residual magnetic field generated by the current from the power source. In prior art methods, this magnetic force may cause immediate deflection of the cathode tip. For example, the immediate deflection may cause the cathode tip to displace a few microns in a direction perpendicular to the magnetic field. In addition, the cathode tip may experience high temperature creeping, which may cause the cathode tip to slowly move in the same direction as the immediate deflection over time. For example, the high temperature creep may cause the cathode tip to displace up to 40 microns over one year. When displacement exceeds as much as 2 microns, cathode re-alignment is needed. However, with the method 300 of the present disclosure, displacement of the cathode tip due to the magnetic force may be reduced. For example, based on the alternating arrangement of the first positive terminal, the second positive terminal, the first negative terminal, and the second negative terminal of the power source, the magnetic forces applied by the magnetic field to the first filament and the second filament may cancel out.

According to an embodiment of the present disclosure, the first filament and the second filament may have the same cross-section. For example, the first filament and the second filament may have a diameter of 30 to 250 μm. In a particular embodiment, the first filament and the second filament may have a diameter of 50 to 150 μm. The first filament and the second filament may be made from a same material. For example, the first filament and the second filament may be a tungsten-rhenium alloy. The tungsten-rhenium alloy may include up to 27% rhenium. For example, the tungsten-rhenium alloy may include 1%, 3%, 5%, 13%, or 20% rhenium, or other commonly-available tungsten-rhenium alloys. Other tungsten alloys may be used.

Figure 3B:
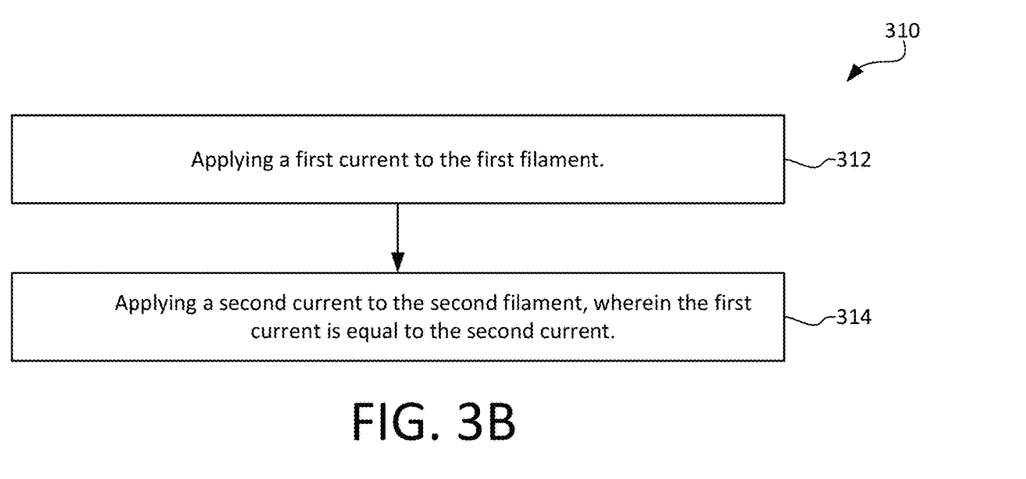
FIG. 3B is a flowchart of details of step 310 in the method of FIG. 3A.

The first filament and the second filament may carry the same current. For example step 310 may comprise the following steps, as shown in FIG. 3B. At step 312, a first current is applied to the first filament. At step 314, a second current is applied to the second filament. For example, the first current and the second current may be between 1 A and 2 A, but other currents may be applied depending on the particular design and system conditions.

It can be appreciated that the similarity of the parameters of the first filament and the second filament may result in similar magnetic forces being applied by the magnetic field in opposing directions. Therefore, the magnetic forces applied to the first filament and the second filament may cancel out and reduce displacement of the cathode tip.

According to an embodiment of the present disclosure, the first filament and the second filament may be made of different materials. For example, the first filament may be comprised of a first material, and the second filament may be comprised of a second material. The first material may be a tungsten-rhenium alloy including up to 5% rhenium. The second material may be a tungsten-rhenium alloy including 20% to 27% rhenium. Other combinations of tungsten alloys may be used. The first filament and the second filament may have different cross sections. For example, a cross-section of the first filament and a cross-section of the second filament may be inversely proportional to a specific resistance of the first material and a specific resistance of the second material. In a particular embodiment, the first filament may have a diameter of 70 to 80 microns, and the second filament may have a diameter of 110 to 120 microns. The first filament and the second filament may carry the different currents. It can be appreciated that the specific parameters of the first filament and the second filament may be different, but they may still result in similar magnetic forces applied by the magnetic field in opposing directions. Therefore, the magnetic forces applied to the first filament and the second filament may cancel out and reduce displacement of the cathode tip.

Figure 4A:
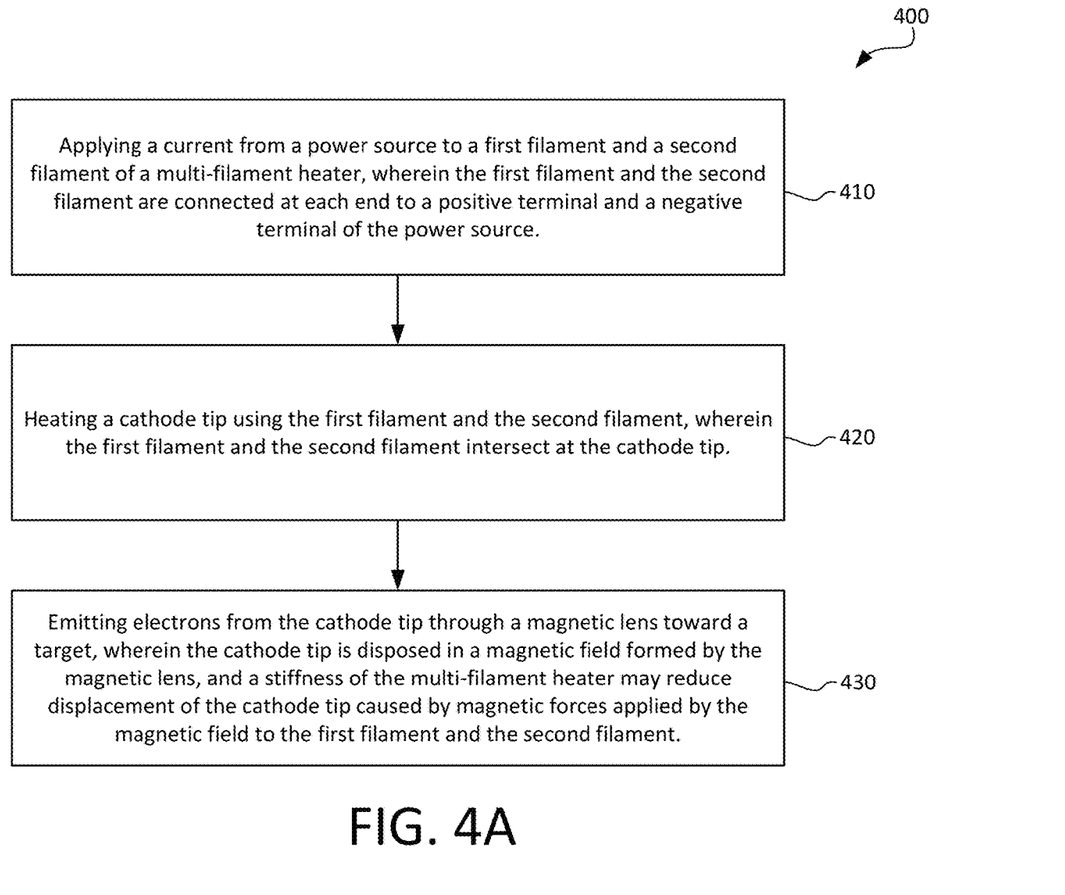
FIG. 4A is a flowchart of a method of generating an electron beam using a magnetic immersion electron gun according to another embodiment of the present disclosure.

An embodiment of the present disclosure provides a method 400 of generating an electron beam using a magnetic immersion electron gun. The method 400 may be applied to the electron gun 200 of the present disclosure. As shown in FIG. 4A, the method 400 may comprise the following steps.

At step 410, a current from a power source is applied to a first filament and a second filament of a multi-filament heater. The first filament and the second filament may be connected at each end to a positive terminal and a negative terminal to a power source. For example, a first end of the first filament and a first end of the second filament may be connected to the positive terminal of the power source, and a second end of the first filament and a second end of the second filament may be connected to the negative terminal of the power source. An example is shown in FIG. 2A.

At step 420, a cathode tip is heated using the first filament and the second filament. The cathode tip may be comprised of tungsten single crystal. The cathode tip may be a sharp needle about 2 mm long and 120 μm in diameter. The end of the cathode tip may be less than 1 micron. The heater may heat the cathode tip to a temperature between 1600K and 1900K. For example, the heater may heat the cathode tip to a temperature of 1800K. The first filament and the second filament may intersect at the cathode tip. The first filament and the second filament may intersect at an angle between 0 degrees (i.e., touching but not crossing) and 90 degrees. For example, the first filament and the second filament may intersect at an acute angle. In this way, current from the power source may travel through the first filament and the second filament to directly heat the cathode tip.

At step 430, electrons are emitted from the cathode tip through a magnetic lens toward a target. The cathode tip may be disposed in a magnetic field formed by the magnetic lens. The magnetic lens may have an annular shape, defining an aperture. The aperture may have a diameter of less than 1 mm. For example, the aperture may have a diameter between 50 and 100 microns. The magnetic field may have a magnetic flux density between 100 Gauss and 1000 Gauss, or more. For example, the magnetic field may have a magnetic flux density of 600 Gauss. Stiffness of the heater may reduce displacement of the cathode tip caused by magnetic forces applied by the magnetic field to the first filament and the second filament. For example, the heater may be 6 to 12 times stiffer than previous designs.

According to an embodiment of the present disclosure, the first filament and the second filament may have the same cross-section. For example, the first filament and the second filament may have a diameter of 30 to 250 μm. In a particular embodiment, the first filament and the second filament may have a diameter of 50 to 150 μm. The first filament and the second filament may be made from a same material. For example, the first filament and the second filament may be a tungsten-rhenium alloy. The tungsten-rhenium alloy may include up to 27% rhenium. For example, the tungsten-rhenium alloy may include 1%, 3%, 5%, 13%, or 20% rhenium, or other commonly-available tungsten-rhenium alloys. Other tungsten alloys may be used.

Figure 4B:
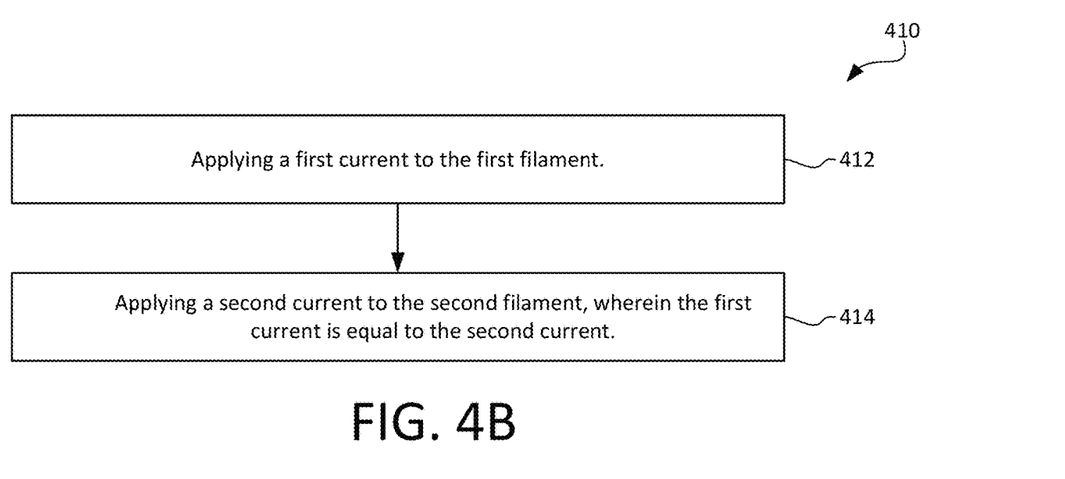
FIG. 4B is a flowchart of details of step 410 in the method of FIG. 4A.

The first filament and the second filament may carry the same current. For example step 410 may comprise the following steps, as shown in FIG. 4B. At step 412, a first current is applied to the first filament. At step 414, a second current is applied to the second filament. For example, the first current and the second current may be between 1 A and 2 A, but other currents may be applied depending on the particular design and system conditions.

It can be appreciated that the similarity of the parameters of the first filament and the second filament may result in a uniform stiffness in the heater. Therefore, the magnetic forces applied to the first filament and the second filament may result in reduced displacement of the cathode tip compared to prior art designs due to the stiffness of the electron gun 200.

Figure 5:
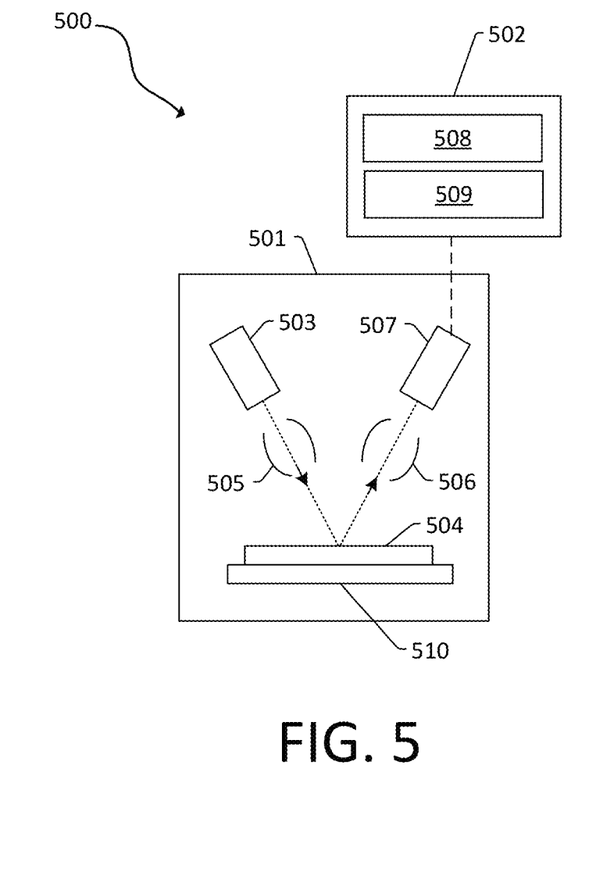
FIG. 5 is a schematic diagram of an inspection system according to an embodiment of the present disclosure.

FIG. 5 is a block diagram of an embodiment of a system 500. The system 500 includes a wafer inspection tool (which includes the electron column 501) configured to generate images of a wafer 504.

The wafer inspection tool includes an output acquisition subsystem that includes at least an energy source and a detector. The output acquisition subsystem may be an electron beam-based output acquisition subsystem. For example, in one embodiment, the energy directed to the wafer 504 includes electrons, and the energy detected from the wafer 504 includes electrons. In this manner, the energy source may be an electron beam source. In one such embodiment shown in FIG. 5, the output acquisition subsystem includes electron column 501, which is coupled to computer subsystem 502. A stage 510 may hold the wafer 504.

As also shown in FIG. 5, the electron column 501 includes an electron beam source configured to generate electrons that are focused to wafer 504 by one or more elements 505. The electron beam source 503 may include, for example, a cathode source or emitter tip, including electron gun 100 or electron gun 200 of the present disclosure. The one or more elements 505 may include, for example, a magnetic lens 110 (or magnetic lens 210), a gun lens, an anode, a beam limiting aperture, a gate valve, a beam current selection aperture, an objective lens, and a scanning subsystem, all of which may include any such suitable elements known in the art.

Electrons returned from the wafer 504 (e.g., secondary electrons) may be focused by one or more elements 506 to detector 507. One or more elements 506 may include, for example, a scanning subsystem, which may be the same scanning subsystem included in element(s) 505.

The electron column 501 also may include any other suitable elements known in the art.

Although the electron column 501 is shown in FIG. 5 as being configured such that the electrons are directed to the wafer 504 at an oblique angle of incidence and are scattered from the wafer 504 at another oblique angle, the electron beam may be directed to and scattered from the wafer 504 at any suitable angles. In addition, the electron beam-based output acquisition subsystem may be configured to use multiple modes to generate images of the wafer 504 (e.g., with different illumination angles, collection angles, etc.). The multiple modes of the electron beam-based output acquisition subsystem may be different in any image generation parameters of the output acquisition subsystem.

Computer subsystem 502 may be coupled to detector 507 as described above. The detector 507 may detect electrons returned from the surface of the wafer 504 thereby forming electron beam images of the wafer 504. The electron beam images may include any suitable electron beam images. Computer subsystem 502 may be configured to perform any of the functions described herein using the output of the detector 507 and/or the electron beam images. Computer subsystem 502 may be configured to perform any additional step(s) described herein. A system 500 that includes the output acquisition subsystem shown in FIG. 5 may be further configured as described herein.

It is noted that FIG. 5 is provided herein to generally illustrate a configuration of an electron beam-based output acquisition subsystem that may be used in the embodiments described herein. The electron beam-based output acquisition subsystem configuration described herein may be altered to optimize the performance of the output acquisition subsystem as is normally performed when designing a commercial output acquisition system. In addition, the systems described herein may be implemented using an existing system (e.g., by adding functionality described herein to an existing system). For some such systems, the methods described herein may be provided as optional functionality of the system (e.g., in addition to other functionality of the system). Alternatively, the system described herein may be designed as a completely new system.

Although the output acquisition subsystem is described above as being an electron beam-based output acquisition subsystem, the output acquisition subsystem may be an ion beam-based output acquisition subsystem. Such an output acquisition subsystem may be configured as shown in FIG. 5 except that the electron beam source may be replaced with any suitable ion beam source known in the art. In addition, the output acquisition subsystem may be any other suitable ion beam-based output acquisition subsystem such as those included in commercially available focused ion beam (FIB) systems, helium ion microscopy (HIM) systems, and secondary ion mass spectroscopy (SIMS) systems.

The computer subsystem 502 includes a processor 508 and an electronic data storage unit 509. The processor 508 may include a microprocessor, a microcontroller, or other devices.

The computer subsystem 502 may be coupled to the components of the system 500 in any suitable manner (e.g., via one or more transmission media, which may include wired and/or wireless transmission media) such that the processor 508 can receive output. The processor 508 may be configured to perform a number of functions using the output. The wafer inspection tool can receive instructions or other information from the processor 508. The processor 508 and/or the electronic data storage unit 509 optionally may be in electronic communication with another wafer inspection tool, a wafer metrology tool, or a wafer review tool (not illustrated) to receive additional information or send instructions.

The processor 508 is in electronic communication with the wafer inspection tool, such as the detector 507. The processor 508 may be configured to process images generated using measurements from the detector 507. For example, the processor may perform embodiments of the method 300 or method 400.

The computer subsystem 502, other system(s), or other subsystem(s) described herein may be part of various systems, including a personal computer system, image computer, mainframe computer system, workstation, network appliance, internet appliance, or other device. The subsystem(s) or system(s) may also include any suitable processor known in the art, such as a parallel processor. In addition, the subsystem(s) or system(s) may include a platform with high-speed processing and software, either as a standalone or a networked tool.

The processor 508 and electronic data storage unit 509 may be disposed in or otherwise part of the system 500 or another device. In an example, the processor 508 and electronic data storage unit 509 may be part of a standalone control unit or in a centralized quality control unit. Multiple processors 508 or electronic data storage units 509 may be used.

The processor 508 may be implemented in practice by any combination of hardware, software, and firmware. Also, its functions as described herein may be performed by one unit, or divided up among different components, each of which may be implemented in turn by any combination of hardware, software and firmware. Program code or instructions for the processor 508 to implement various methods and functions may be stored in readable storage media, such as a memory in the electronic data storage unit 509 or other memory.

If the system 500 includes more than one computer subsystem 502, then the different subsystems may be coupled to each other such that images, data, information, instructions, etc. can be sent between the subsystems. For example, one subsystem may be coupled to additional subsystem(s) by any suitable transmission media, which may include any suitable wired and/or wireless transmission media known in the art. Two or more of such subsystems may also be effectively coupled by a shared computer-readable storage medium (not shown).

The processor 508 may be configured to perform a number of functions using the output of the system 500 or other output. For instance, the processor 508 may be configured to send the output to an electronic data storage unit 509 or another storage medium. The processor 508 may be further configured as described herein.

The processor 508 or computer subsystem 502 may be part of a defect review system, an inspection system, a metrology system, or some other type of system. Thus, the embodiments disclosed herein describe some configurations that can be tailored in a number of manners for systems having different capabilities that are more or less suitable for different applications.

The processor 508 may be configured according to any of the embodiments described herein. The processor 508 also may be configured to perform other functions or additional steps using the output of the system 500 or using images or data from other sources. For example, the processor 508 can adjust the current to the electron beam source 503.

The processor 508 may be communicatively coupled to any of the various components or sub-systems of system 500 in any manner known in the art. Moreover, the processor 508 may be configured to receive and/or acquire data or information from other systems (e.g., inspection results from an inspection system such as a review tool, a remote database including design data and the like) by a transmission medium that may include wired and/or wireless portions. In this manner, the transmission medium may serve as a data link between the processor 508 and other subsystems of the system 500 or systems external to system 500.

Various steps, functions, and/or operations of system 500 and the methods disclosed herein are carried out by one or more of the following: electronic circuits, logic gates, multiplexers, programmable logic devices, ASICs, analog or digital controls/switches, microcontrollers, or computing systems. Program instructions implementing methods such as those described herein may be transmitted over or stored on carrier medium. The carrier medium may include a storage medium such as a read-only memory, a random access memory, a magnetic or optical disk, a non-volatile memory, a solid state memory, a magnetic tape, and the like. A carrier medium may include a transmission medium such as a wire, cable, or wireless transmission link. For instance, the various steps described throughout the present disclosure may be carried out by a single processor 508 (or computer subsystem 502) or, alternatively, multiple processors 508 (or multiple computer subsystems 502). Moreover, different sub-systems of the system 500 may include one or more computing or logic systems. Therefore, the above description should not be interpreted as a limitation on the present disclosure but merely an illustration.

Although the present disclosure has been described with respect to one or more particular embodiments, it will be understood that other embodiments of the present disclosure may be made without departing from the scope of the present disclosure. Hence, the present disclosure is deemed limited only by the appended claims and the reasonable interpretation thereof.

What is claimed is:

1. A magnetic immersion electron gun comprising:
 a magnetic lens forming a magnetic field;
 a cathode tip disposed in the magnetic field; and
 a multi-filament heater configured to directly heat the cathode tip to emit electrons through the magnetic lens;
 wherein the multi-filament heater comprises:
  a first filament connected at each end to a first positive terminal and a second positive terminal of a power source; and
  a second filament connected at each end to a first negative terminal and a second negative terminal of the power source;
 wherein the first positive terminal, the second positive terminal, the first negative terminal, and the second negative terminal are arranged alternately around the cathode tip such that the first filament and the second filament intersect at the cathode tip and magnetic forces applied by the magnetic field to the first filament and the second filament cancel out to reduce a resultant magnetic force applied to the cathode tip.

2. The magnetic immersion electron gun of claim 1, wherein the first filament and the second filament have a same cross-section, are made from a same material, and carry a same current.

3. The magnetic immersion electron gun of claim 2, wherein the material is a tungsten-rhenium alloy including up to 27% rhenium.

4. The magnetic immersion electron gun of claim 1, wherein the first filament is comprised of a first material, the second filament is comprised of a second material different from the first material, and a cross-section of the first filament and a cross-section of the second filament are inversely proportional to a specific resistance of the first material and a specific resistance of the second material.

5. The magnetic immersion gun of claim 4, wherein the first material is a tungsten-rhenium alloy including up to 5% rhenium, and the second material is a tungsten-rhenium alloy including from 20 to 27% rhenium.

6. The magnetic immersion gun of claim 1, wherein the first filament and the second filament are orthogonal.

7. The magnetic immersion gun of claim 1, wherein the multi-filament heater is configured to directly heat the cathode tip to a temperature between 1600K and 1900K.

8. The magnetic immersion gun of claim 1, wherein the magnetic field has a magnetic flux density between 100 Gauss and 1000 Gauss.

9. A magnetic immersion electron gun comprising:
 a magnetic lens forming a magnetic field;
 a cathode tip disposed in the magnetic field;
 a power source having a positive terminal and a negative terminal; and
 a multi-filament heater configured to directly heat the cathode tip to emit electrons through the magnetic lens;
 wherein the multi-filament heater comprises a first filament and a second filament that are both connected to the positive terminal and that are both connected to the negative terminal of the power source, and the first filament and the second filament intersect at the cathode tip.

10. The magnetic immersion electron gun of claim 9, wherein the first filament and the second filament have a same cross-section, are made from a same material, and carry a same current.

11. The magnetic immersion electron gun of claim 10, wherein the material is a tungsten-rhenium alloy including up to 27% rhenium.

12. The magnetic immersion electron gun of claim 9, wherein the first filament and the second filament intersect at an acute angle.

13. A method of generating an electron beam using a magnetic immersion electron gun comprising:
  applying a current from a power source to a first filament and a second filament of a multi-filament heater, wherein the first filament is connected at each end to a first positive terminal and a second positive terminal of the power source, and the second filament is connected at each end to a first negative terminal and a second negative terminal of the power source;
  heating a cathode tip using the first filament and the second filament, wherein the first filament and the second filament intersect at the cathode tip, and the first positive terminal, the second positive terminal, the first negative terminal, and the second negative terminal are arranged alternately around the cathode tip; and
  emitting electrons from the cathode tip through a magnetic lens toward a target, wherein the cathode tip is disposed in a magnetic field formed by the magnetic lens, and magnetic forces applied by the magnetic field to the first filament and the second filament cancel out to reduce a resultant magnetic force applied to the cathode tip.

14. The method of claim 13, wherein applying a current from a power source to the first filament and the second filament comprises:
  applying a first current to the first filament; and
  applying a second current to the second filament;
  wherein the first current is equal to the second current.

15. The method of claim 13, wherein the first filament and the second filament are comprised of a tungsten-rhenium alloy including up to 27% rhenium.

16. The method of claim 13, wherein the first filament is comprised of a first material, the second filament is comprised of a second material different from the first material, and a cross-section of the first filament and a cross-section of the second filament are inversely proportional to a specific resistance of the first material and a specific resistance of the second material.

17. The method of claim 16, wherein the first material is a tungsten-rhenium alloy including up to 5% rhenium, and the second material is a tungsten-rhenium alloy including from 20 to 27% rhenium.

18. The method of claim 13, wherein the first filament and the second filament are orthogonal.

19. The method of claim 13, wherein heating the cathode tip to using the first filament and the second filament comprises:
  heating the cathode tip to using the first filament and the second filament to a temperature between 1600K and 1900K.

20. The method of claim 13, wherein the magnetic field has a magnetic flux density between 100 Gauss and 1000 Gauss.

\* \* \* \* \*